US010580568B2

(12) United States Patent
Yen et al.

(10) Patent No.: US 10,580,568 B2
(45) Date of Patent: Mar. 3, 2020

(54) SEMICONDUCTOR ELEMENT

(71) Applicant: REALTEK SEMICONDUCTOR CORPORATION, Hsinchu (TW)

(72) Inventors: Hsiao-Tsung Yen, Hsinchu (TW); Cheng-Wei Luo, Hsinchu (TW); Yuh-Sheng Jean, Hsinchu County (TW); Ta-Hsun Yeh, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 15/649,503

(22) Filed: Jul. 13, 2017

(65) Prior Publication Data
US 2018/0040413 A1 Feb. 8, 2018

(30) Foreign Application Priority Data

Aug. 5, 2016 (TW) .............................. 105124934 A

(51) Int. Cl.
*H01F 27/28* (2006.01)
*H01F 17/00* (2006.01)
(Continued)

(52) U.S. Cl.
CPC ..... *H01F 27/2804* (2013.01); *H01F 17/0006* (2013.01); *H01F 27/29* (2013.01);
(Continued)

(58) Field of Classification Search
USPC ................ 336/184, 200, 223, 232, 182, 180
See application file for complete search history.

(56) References Cited

U.S. PATENT DOCUMENTS 6,577,219 B2   6/2003   Visser
7,151,430 B2  12/2006   Mattsson
(Continued)

FOREIGN PATENT DOCUMENTS

CN      1522450 A    8/2004
CN    101253586 A    8/2008
(Continued)

OTHER PUBLICATIONS

The National Intellectual Property Administration(Chinese Patent Office), OA letter of the counterpart CN application (appl. No. 201610665333.5) of that US application (U.S. Appl. No. 15/649,347) dated Oct. 22, 2018.
(Continued)

*Primary Examiner* — Elvin G Enad
*Assistant Examiner* — Kazi S Hossain
(74) *Attorney, Agent, or Firm* — WPAT, PC

(57) ABSTRACT

A semiconductor element includes a first spiral coil, a second spiral coil, a connecting section, a first guide segment, and a second guide segment. The first spiral coil is formed with a first end and a second end, and includes a first inner turn and a first outer turn. The first inner turn is located in a range surrounded by the outer turn, and the first end and the second end are located at the first inner turn. The second spiral coil and the first spiral coil are located in substantially a same metal layer. The connecting section connects the first spiral coil and the second spiral coil. The first guide segment is connected to the first end. The second guide segment is connected to the second end. The first guide segment and the second guide segment are fabricated in a metal layer different from a metal layer of the first spiral coil.

5 Claims, 10 Drawing Sheets

(51) Int. Cl.
- *H01F 27/29* (2006.01)
- *H01L 23/522* (2006.01)
- *H01L 49/02* (2006.01)
- *H01F 19/04* (2006.01)

(52) U.S. Cl.
CPC .......... *H01L 23/5227* (2013.01); *H01L 28/10* (2013.01); *H01F 19/04* (2013.01); *H01F 2017/0046* (2013.01); *H01F 2017/0073* (2013.01); *H01F 2017/0086* (2013.01); *H01F 2027/2809* (2013.01)

(56) References Cited

U.S. PATENT DOCUMENTS

| | | |
|---|---|---|
| 7,642,891 B2 | 1/2010 | Einzinger et al. |
| 8,008,978 B2 | 8/2011 | Deguchi |
| 8,183,971 B2 | 5/2012 | Le Guillou et al. |
| 8,305,182 B1 | 11/2012 | Tsai et al. |
| 8,543,190 B2 | 9/2013 | Wasson et al. |
| 9,299,764 B2 | 3/2016 | Mattsson et al. |
| 2003/0001709 A1 | 1/2003 | Visser |
| 2007/0158782 A1* | 7/2007 | Heikkinen .......... H01F 17/0006 257/531 |
| 2009/0045903 A1* | 2/2009 | Lin .................... H01F 17/0006 336/200 |
| 2010/0164667 A1* | 7/2010 | Ho-Hsiang ......... H01F 17/0006 336/137 |
| 2012/0044034 A1 | 2/2012 | Nazarian et al. |
| 2015/0206634 A1 | 7/2015 | Yan et al. |
| 2016/0118180 A1 | 4/2016 | Chen et al. |
| 2017/0012601 A1* | 1/2017 | Yen .......................... H03H 7/42 |
| 2017/0098500 A1 | 4/2017 | Yen et al. |
| 2017/0200547 A1 | 7/2017 | Yen et al. |

FOREIGN PATENT DOCUMENTS

| | | |
|---|---|---|
| CN | 101673865 B | 2/2014 |
| CN | 104584152 A | 4/2015 |
| JP | 2005327931 A | 11/2005 |
| TW | 201248658 | 12/2012 |

OTHER PUBLICATIONS

OA letter of an US application (U.S. Appl. No. 15/649,347) dated Sep. 21, 2018.
Taiwan Intellectual Property Office, "Office Action", dated Feb. 2, 2018.
OA letter of the counterpart CN application (appl. No. 201610663400.X) dated Mar. 4, 2019.
OA letter of the CN application (appl. No. 201610665108.1) dated Mar. 4, 2019.
OA letter of application No. 15649465 dated Nov. 27, 2018.

\* cited by examiner

SEMICONDUCTOR ELEMENT

BACKGROUND OF THE INVENTION

1. Field of the Invention

The present invention relates to a semiconductor element, especially to a semiconductor element that can be used as an integrated inductor and an integrated transformer.

2. Description of Related Art

Inductors and transformers are important elements in radio frequency integrated circuits to implement single-ended to differential signal conversion, signal coupling and impedance matching. As System-on-chips (SoC) become the mainstream of integrated circuits, integrated inductors and integrated transformers are gradually substituted for conventional discrete elements and are commonly applied to radio frequency integrated circuits. However, inductors and transformers in integrated circuits often take up large areas; therefore, it becomes an important issue to reduce the areas of inductors and transformers in integrated circuits without degrading element performances, such as inductance, quality factor (Q), and coupling coefficient (K).

FIG. 1 illustrates a structure of a conventional 8-shaped integrated inductor. An 8-shaped integrated inductor 100 includes a spiral coil 110 and a spiral coil 120. The spiral coil 110 (120) includes a metal segment 112 (122) and a metal segment 114 (124). The metal segment 112 (122) and the metal segment 114 (124) are connected by through structures at through positions. The through structures can be via structures or a via array. In operation, signals are inputted at one connecting terminal 111 (or 121) of the 8-shaped integrated inductor 100 and outputted at the other connecting terminal 121 (or 111). The 8-shaped integrated inductor 100 has an obvious drawback, that the spiral coil 110 or the spiral coil 120 itself has unsatisfactory symmetry, causing poor performances of the quality factor and the inductance of the 8-shaped integrated inductor 100. Moreover, the two connecting terminals 111 and 121 of the 8-shaped integrated inductor 100 are distant from each other, such that the connection with differential elements in an integrated circuit becomes difficult (which becomes even more apparent as the numbers of turns of the spiral coils get greater).

SUMMARY OF THE INVENTION

In view of the issues of the prior art, an object of this invention is to provide a semiconductor element, so as to improve the performance of an integrated inductor and an integrated transformer.

The present invention discloses a semiconductor element comprising a first spiral coil, a second spiral coil, a connecting section, a first guide segment, and a second guide segment. The first spiral coil is formed with a first end and a second end, and comprises a first inner turn and a first outer turn. The first inner turn is located in a range surrounded by the first outer turn, and the first end and the second end are located at the first inner turn. The second spiral coil and the first spiral coil are located in substantially a same metal layer. The connecting section connects the first spiral coil and the second spiral coil. The first guide segment is connected to the first end. The second guide segment is connected to the second end. The first guide segment and the second guide segment are fabricated in a metal layer different from a metal layer of the first spiral coil.

The present invention also discloses a semiconductor element comprising a first spiral coil, a second spiral coil, a connecting section, a first guide segment, and a second guide segment. The first spiral coil is formed with a first end and a second end, and comprises a first inner turn and a first outer turn. The first inner turn is located in a range surrounded by the first outer turn, and the first end and the second end are located at the first inner turn. The second spiral coil and the first spiral coil are located at substantially a same metal layer. The connecting section connects the first spiral coil and the second spiral coil, and comprises a first connecting segment located in a first metal layer and a second connecting segment located in a second metal layer. The first connecting segment and the second connecting segment substantially overlap. The first guide segment is connected to the first end. The second guide segment is connected to the second end. The first guide segment and the second guide segment are fabricated in a metal layer different from a metal layer of the first spiral coil.

The present invention further discloses a semiconductor element comprising a first spiral coil, a second spiral coil, a connecting section, a first guide segment, and a second guide segment. The first spiral coil is formed with a first end and a second end, and comprises a first inner turn and a first outer turn. The first inner turn is located in a range surrounded by the first outer turn, and the first end and the second end are located at the first inner turn. The second spiral coil and the first spiral coil are located in substantially a same metal layer. The connecting section connects the first spiral coil and the second spiral coil, and comprises a first connecting segment and a second connecting segment. Each of the first connecting segment and the second connecting segment comprises two metal segments in different metal layers. The first guide segment is connected to the first end. The second guide segment is connected to the second end. The first guide segment and the second guide segment are fabricated in a metal layer different from a metal layer of the first spiral coil.

In comparison with the prior art, the semiconductor element of the present invention is highly symmetric, which is advantageous in improving the performance of the element.

These and other objectives of the present invention no doubt become obvious to those of ordinary skill in the art after reading the following detailed description of the preferred embodiments with reference to the various figures and drawings.

DETAILED DESCRIPTION OF THE EMBODIMENTS

The following description is written by referring to terms of this technical field. If any term is defined in this specification, such term should be explained accordingly. In addition, the connection between objects or events in the below-described embodiments can be direct or indirect provided that these embodiments are practicable under such connection. Said "indirect" means that an intermediate object or a physical space exists between the objects, or an intermediate event or a time interval exists between the events.

Figure 1:
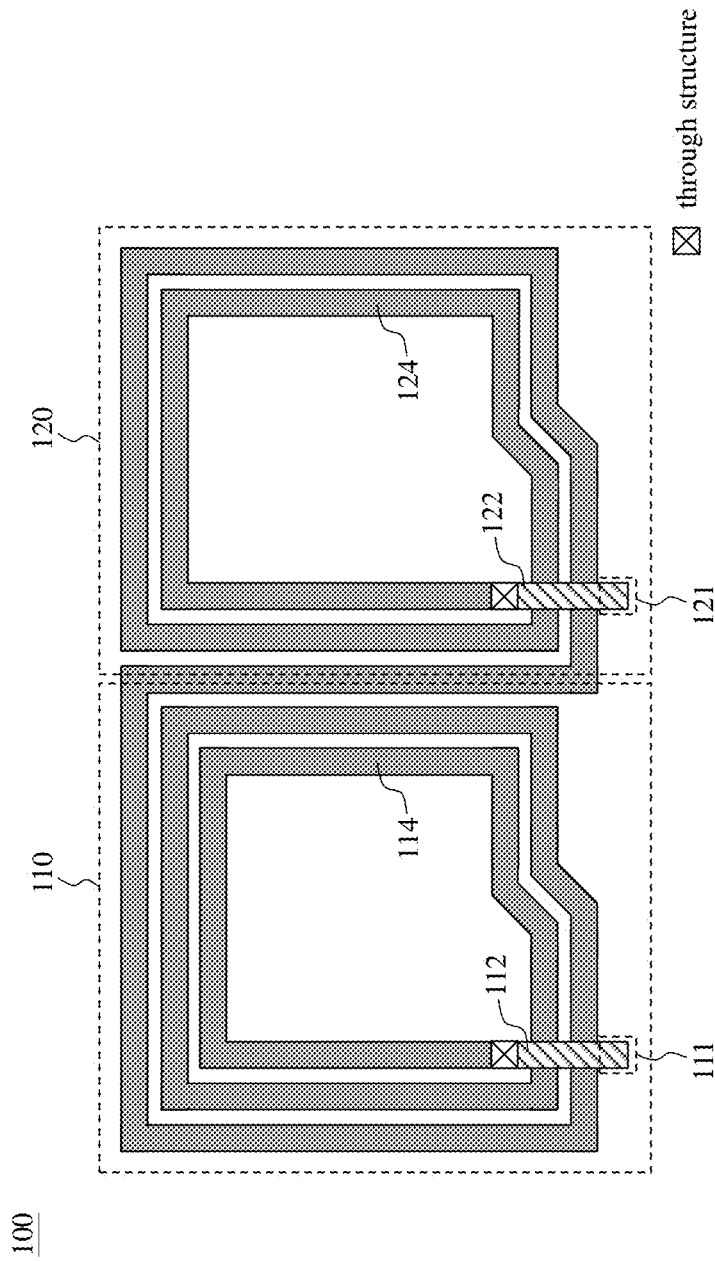
FIG. 1 illustrates a structure of a conventional 8-shaped integrated inductor.
Figure 2A:
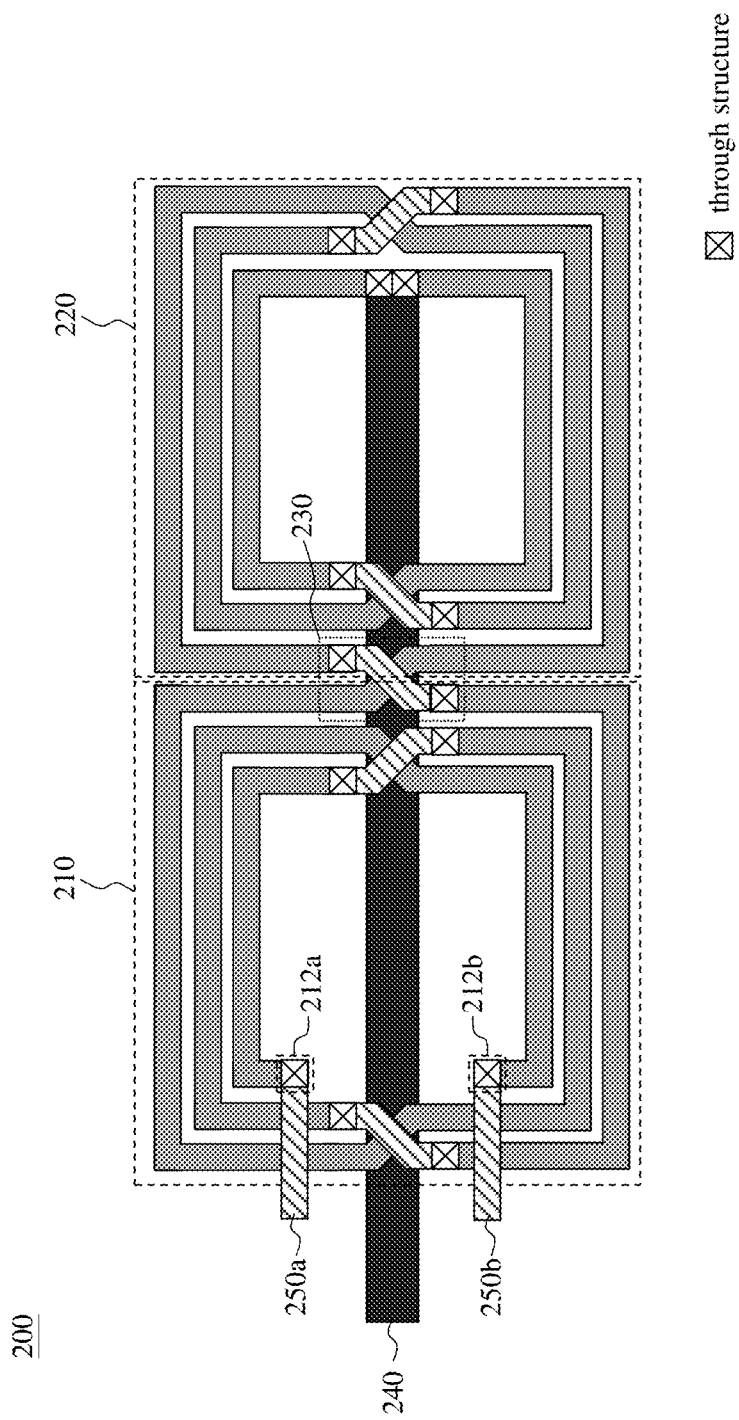
FIG. 2A illustrates a structure of a semiconductor element according to an embodiment of the present invention.

FIG. 2A shows a structure of a semiconductor element according to an embodiment of the present invention. A semiconductor element 200 includes two spiral coils 210 and 220. The spiral coils 210 and 220 are connected by a connection section 230. The metal segments 250a and 250b are guide segments of the semiconductor element 200, together forming a guide segment section of the semiconductor element 200. An end of the metal segment 250a is connected to one end 212a of the spiral coil 210. An end of the metal segment 250b is connected to one other end 212b of the spiral coil 210. A center tap 240 of the semiconductor element 200 is connected to the spiral coil 220, and is fabricated in another metal layer (a metal layer different from the metal layer shaded in gray and the metal layer shaded by slanted lines). The center tap 240 can be regarded as another guide segment of the semiconductor element 200. Metal segments in different metal layers are connected by a through structure, which can be a via structure or a via array.

Figure 2B:
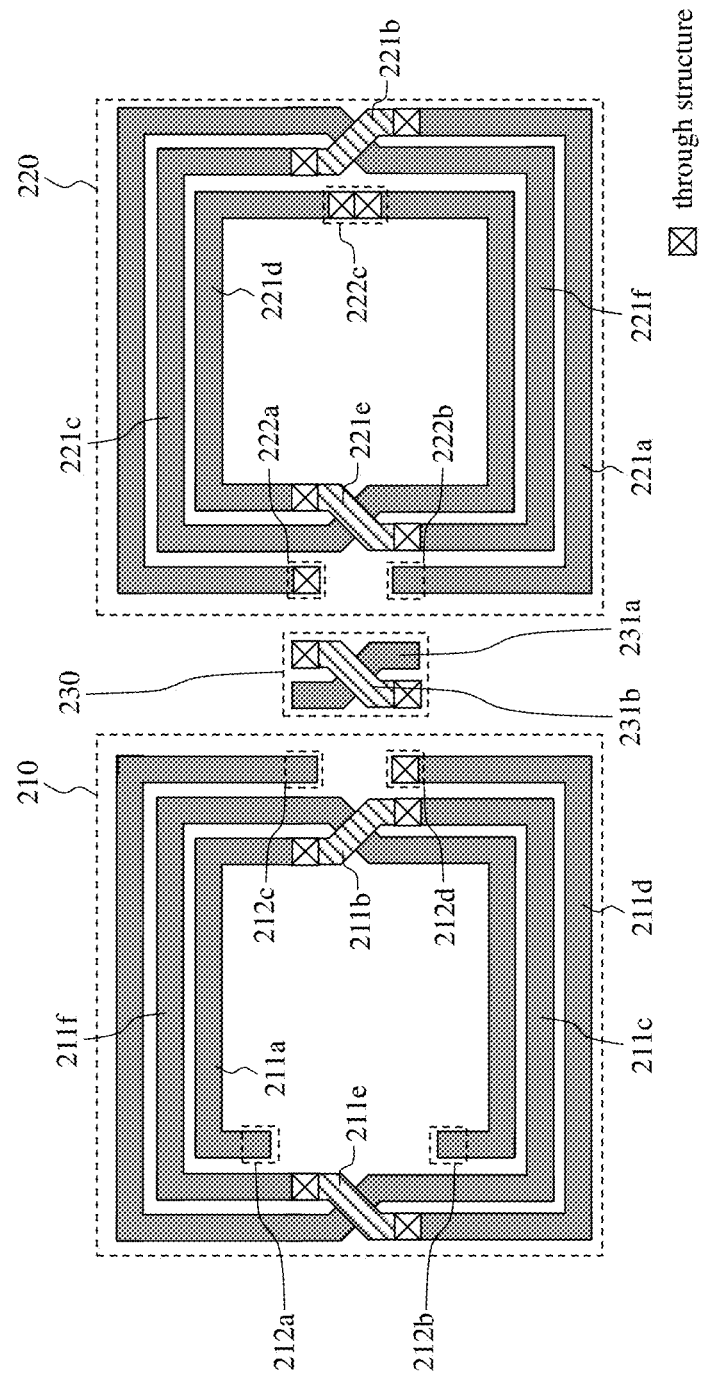
FIG. 2B illustrates the spiral coil 210, the spiral coil 220 and the connection section 230 individually.

FIG. 2B shows the spiral coil 210, the spiral coil 220 and the connection section 230 individually to illustrate the connections among these three components in a detailed manner. Ends 212a and 212b of the spiral coil 210 are respectively connected to the metal segments 250a and 250b. The spiral coil 210 includes metal segments 211a~211f. The metal segments 211b and 211e are fabricated in an upper metal layer (shaded by slanted lines), and the remaining metal segments are fabricated in a lower same metal layer (shaded in gray). The spiral coil 210 is a three-turn spiral structure, of which the inner turn is located in a range surrounded by the outer turn. The innermost turn of the spiral coil 210 includes the metal segment 211a and a lower part of the metal segment 211f. The middle turn of the spiral coil 210 includes an upper part of the metal segment 211f and a lower part of the metal segment 211c. The outermost turn of the spiral coil 210 includes an upper part of the metal segment 211c and the metal segment 211d. Because the metal segments 211b and 211e take up only a small part of the spiral coil 210, the spiral coil 210 is located in substantially the same metal layer, i.e., at substantially the same plane. Similarly, the spiral coil 220 includes the metal segment 221a~221f. The metal segments 221b and 221e are fabricated in an upper metal layer, and the remaining metal segments are fabricated in a lower same metal layer. The spiral coil 220 is a three-turn spiral structure, of which the inner turn is located in a range surrounded by the outer turn. The innermost turn of the spiral coil 220 includes the metal segment 221d and a lower part of the metal segment 221c. The middle turn of the spiral coil 220 includes an upper part of the metal segment 221c and a lower part of the metal segment 221f. The outermost turn of the spiral coil 220 includes an upper part of the metal segment 221f and the metal segment 221a. Likewise, the spiral coil 220 is substantially located in the same metal layer, i.e., at substantially at the same plane. The spiral coil 220 is connected to a center tap 240 through a connecting area 222c. The connecting area 222c is located at an innermost turn of the spiral coil 220, and is an area where the metal segment 221c and the metal segment 221d are connected.

The connection section 230 includes a connecting segment 231a and a connecting segment 231b. Two ends of the connecting segment 231a are respectively connected to the end 212c of the spiral coil 210 and the end 222b of the spiral coil 220. Two ends of the connecting segment 231b are respectively connected to the end 212d of the spiral coil 210 and the end 222a of the spiral coil 220.

In the embodiment of FIG. 2A, the center tap 240 partially overlaps a range surrounded by the spiral coil 210 and a range surrounded by the spiral coil 220. More specifically, the center tap 240 partially overlaps a range surrounded by the outer turn of the spiral coil 210, and the center tap 240 at least partially overlaps a range surrounded by the inner turn of the spiral coil 220. In a different embodiment, the center tap 240 may extend towards the right-hand side of the figure; in this case, the center tap 240 does not overlap a range surrounded by the spiral coil 210, and does not overlap a range surrounded by the inner turn of the spiral coil 220, either.

Figure 3:
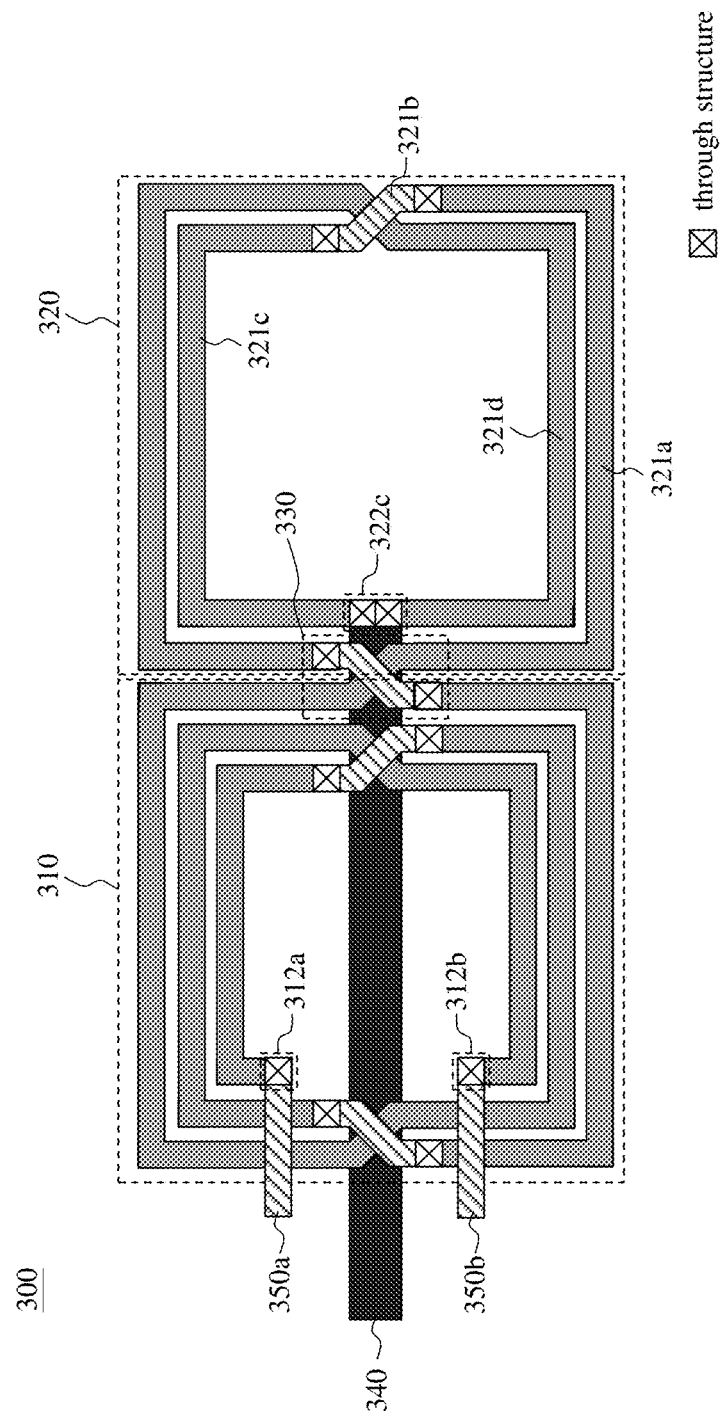
FIG. 3 illustrates a structure of a semiconductor element according to another embodiment of the present invention.

FIG. 3 shows a structure of a semiconductor element according to another embodiment of the present invention. The semiconductor element 300 includes two spiral coils 310 and 320. The spiral coils 310 and 320 are connected by a connection section 330. Similar to the connection section 230, the connection section 330 is made up of two connecting segments. The metal segments 350a and 350b are guide segments of the semiconductor element 300, together forming a guide segment section of the semiconductor element 300. An end of the metal segment 350a is connected to one end 312a of the spiral coil 310. An end of the metal segment 350b is connected to one other end 312b of the spiral coil 310. The spiral coil 310 is a three-turn spiral structure, of which the inner turn is located in a range surrounded by the outer turn. The spiral coil 320 is a two-turn spiral structure, of which the inner turn is located in a range surrounded by the outer turn. The inner turn of the spiral coil 320 includes the metal segment 321c and a lower part of the metal segment 321d. The outer turn of the spiral coil 320 includes an upper of the metal segment 321d and the metal segment 321a. The spiral coil 320 is connected to a center tap 340 through a connecting area 322c. The connecting area 322c is located at an innermost turn of the spiral coil 320, and is an area where the metal segment 321c and the metal segment 321d are connected.

In the embodiment shown in FIG. 3, the center tap 340 partially overlaps and a range surrounded by the spiral coil 310, but does not overlap a range surrounded by the spiral coil 320. More specifically, the center tap 340 partially overlaps a region surrounded by an outer turn of the spiral coil 310, but does not overlap a range surrounded by an inner turn of the spiral coil 320. In a different embodiment, the center tap 340 may extend towards the right-hand side of the figure; in this case, the center tap 340 does not overlap a range surrounded by the spiral coil 310, but partially overlaps a region surrounded by an inner turn of the spiral coil 320.

Figure 4A:
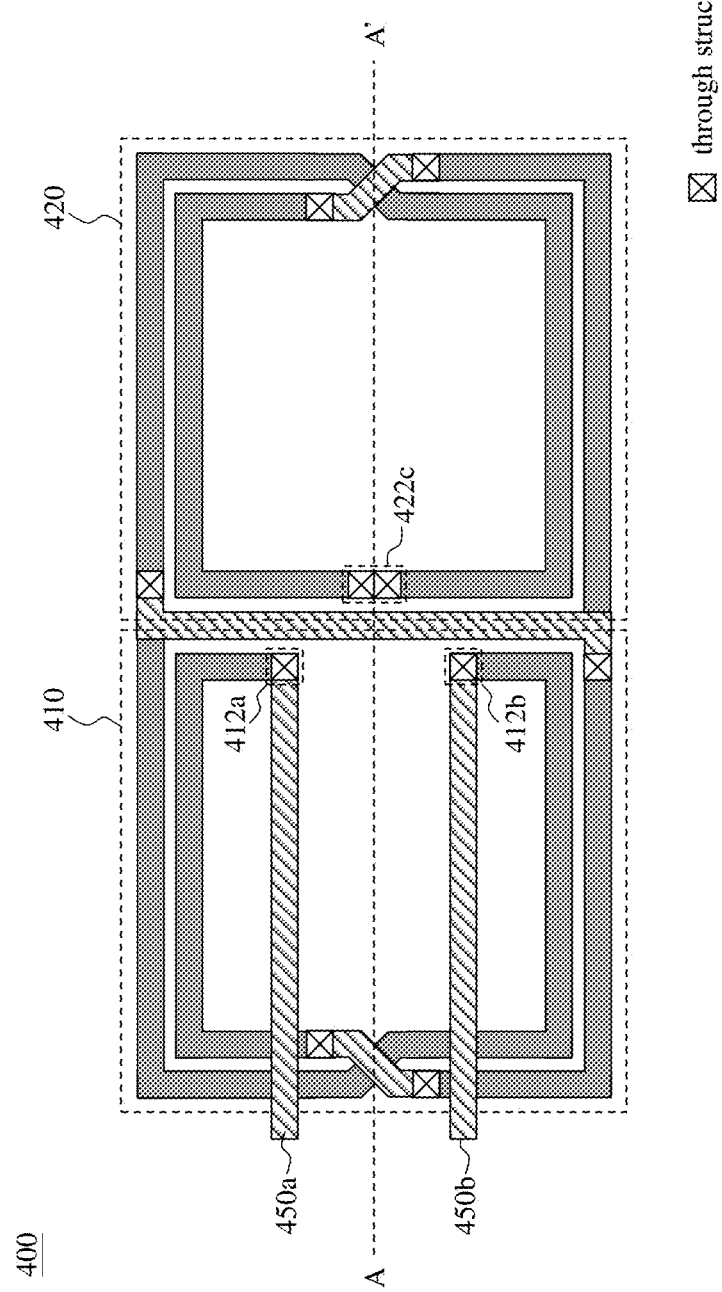
FIG. 4A illustrates a structure of a semiconductor element according to another embodiment of the present invention.

FIG. 4A shows a structure of a semiconductor element according to another embodiment of the present invention.

The semiconductor element 400 includes two spiral coils 410 and 420. The metal segments 450a and 450b are guide segments of the semiconductor element 400, together forming a guide segment section of the semiconductor element 400. The metal segments 450a and 450b are respectively connected to the ends 412a and 412b of the spiral coil 410. A center tap (not shown) of the semiconductor element 400 is connected to a connecting area 422c of the spiral coil 420. The connecting area 422c is located at an innermost turn of the spiral coil 420, and is an area where the metal segment 421a and the metal segment 421b are connected. The center tap may partially overlap a region surrounded by the spiral coil 410 (i.e., extending towards the left-hand side of the figure), or partially overlap a region surrounded by the spiral coil 420 (i.e., extending towards the right-hand side of the figure).

Figure 4B:
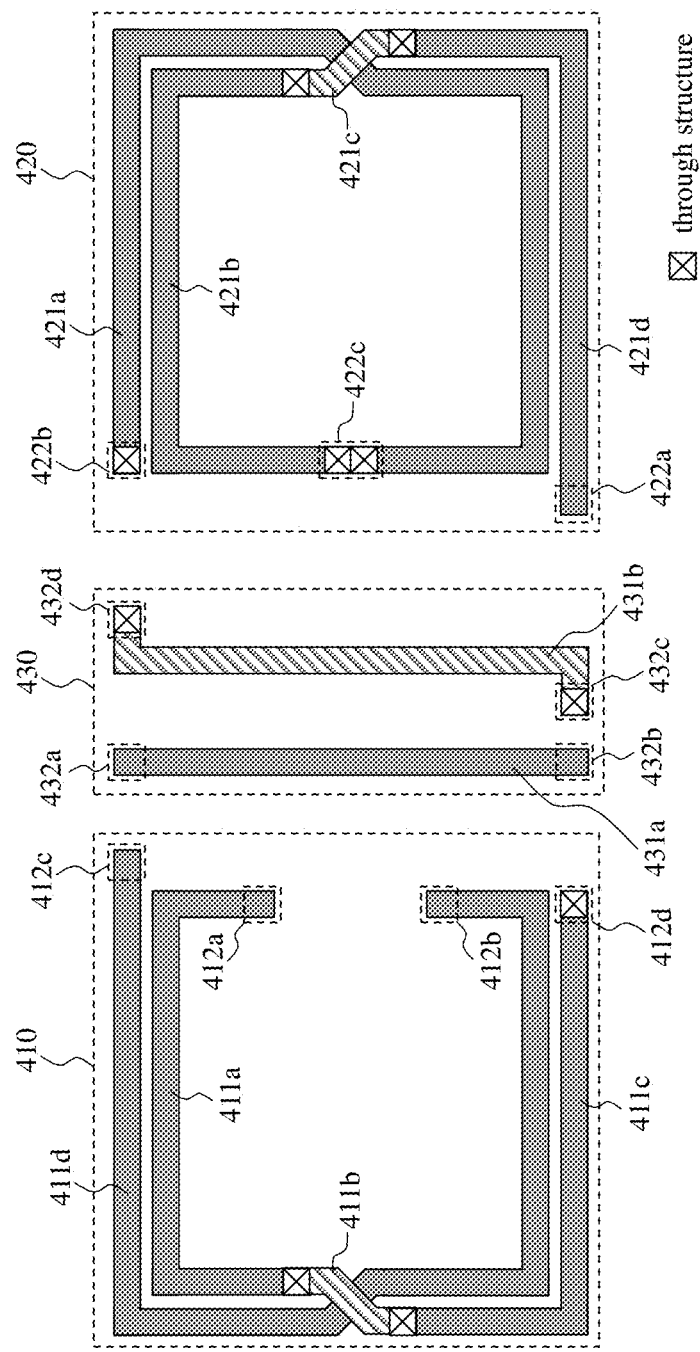
FIG. 4B illustrates the spiral coil 410, the spiral coil 420 and the connection section 430 individually.

FIG. 4B shows the spiral coil 410, the spiral coil 420 and the connection section 430 individually to illustrate the connections among these three components in a detailed manner. The spiral coils 410 and 420 are connected by the connection section 430. The spiral coil 410 includes metal segment 411a-411d. The metal segment 411b is fabricated in an upper metal layer, and the remaining metal segments are fabricated in a lower metal layer. The spiral coil 410 is a two-turn spiral structure, of which the inner turn is located in a range surrounded by the outer turn. The inner turn of the spiral coil 410 includes the metal segment 411a and a lower part of the metal segment 411d. The outer turn of the spiral coil 410 includes an upper of the metal segment 411d and the metal segment 411c. Because the metal segment 411b takes up only a small part of the spiral coil 410, the spiral coil 410 is located at substantially the same metal layer, i.e., at substantially at the same plane. Similarly, the spiral coil 420 includes metal segment 421a-421d. The metal segment 421c is fabricated in the upper metal layer, and the remaining metal segments are fabricated in the lower metal layer. The spiral coil 420 is a two-turn spiral structure, of which the inner turn is located in a range surrounded by the outer turn. The inner turn of the spiral coil 420 includes the metal segment 421b and a lower part of the metal segment 421a. The outer turn of the spiral coil 420 includes an upper of the metal segment 421a and the metal segment 421d. Likewise, the spiral coil 420 is located at substantially the same metal layer, i.e., at substantially the same plane.

Figure 4C:
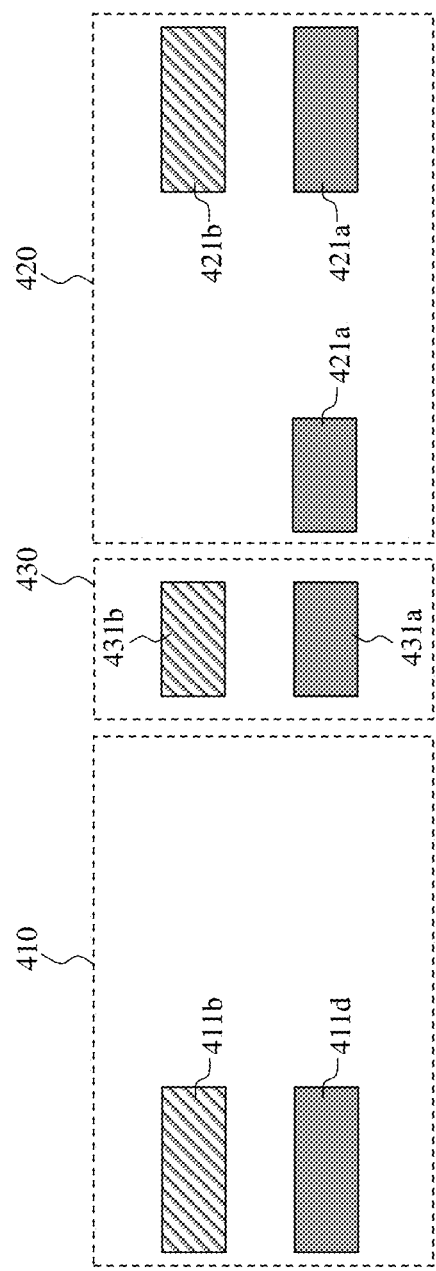
FIG. 4C illustrates a cross section of the semiconductor element 400 along the dotted line A-A' in FIG. 4A.

The connection section 430 includes two connecting segments 431a and 431b. Two ends 432a and 432b of the connecting segment 431a are respectively connected to the end 412c of the spiral coil 410 and the end 422a of the spiral coil 420. Two ends 432c and 432d of the connecting segment 431b are respectively connected to the end 412d of the spiral coil 410 and the end 422b of the spiral coil 420. The connecting segments 431a and 431b substantially overlap, and the connecting segment 431b is located above the connecting segment 431a. The connecting segment 431a is located at the same plane as the spiral coil 410 and the spiral coil 420, and the spiral coil 410 is directly connected to the spiral coil 420. The connecting segment 431b is connected to the spiral coil 410 and the spiral coil 420 by through structures. FIG. 4C shows a cross section of the semiconductor element 400 along the dotted line A-A' in FIG. 4A. As shown in the figure, the connecting segment 431b is located above the connecting segment 431a; the two overlap without coming in touch.

In a different embodiment, the spiral coil 410 can have an odd number of turns (similar to the spiral coils 210 and 310); in this case, the metal segments 450a and 450b do not overlap a range surrounded by an inner turn of the spiral coil 410, and do not overlap a range surrounded by the spiral coil 420, either.

Figure 5A:
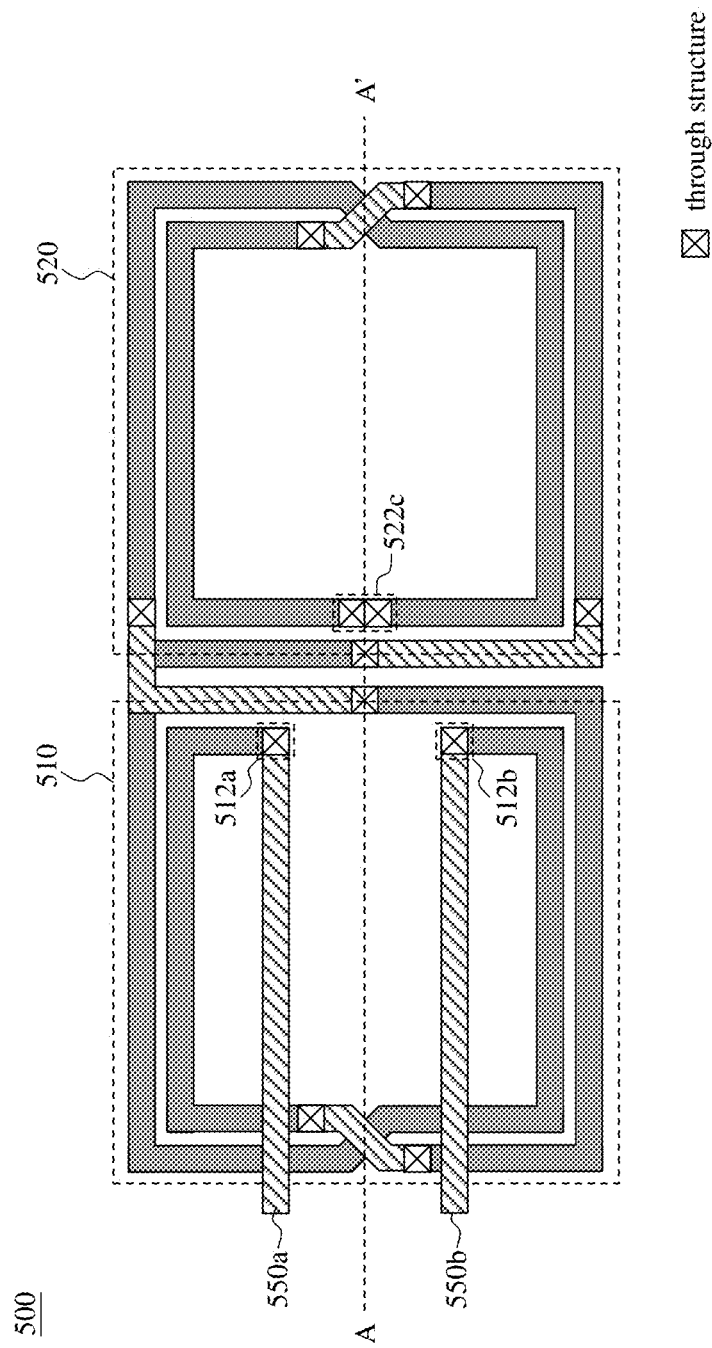
FIG. 5A illustrates a structure of a semiconductor element according to another embodiment of the present invention.

FIG. 5A shows a structure of a semiconductor element according to another embodiment of the present invention. The semiconductor element 500 includes two spiral coils 510 and 520. The metal segments 550a and 550b are guide segments of the semiconductor element 500, together forming a guide segment section of the semiconductor element 500. The metal segments 550a and 550b are respectively connected to ends 512a and 512b of the spiral coil 510. A center tap (not shown) of the semiconductor element 500 is connected to a connecting area 522c of the spiral coil 520. The connecting area 522c is located at an innermost turn of the spiral coil 520, and is an area where the metal segment 521a and the metal segment 521b are connected. The center tap may partially overlap a region surrounded by the spiral coil 510 (extending towards the left-hand side of the figure), or partially overlap a region surrounded by the spiral coil 520 (extending towards the right-hand side of the figure).

Figure 5B:
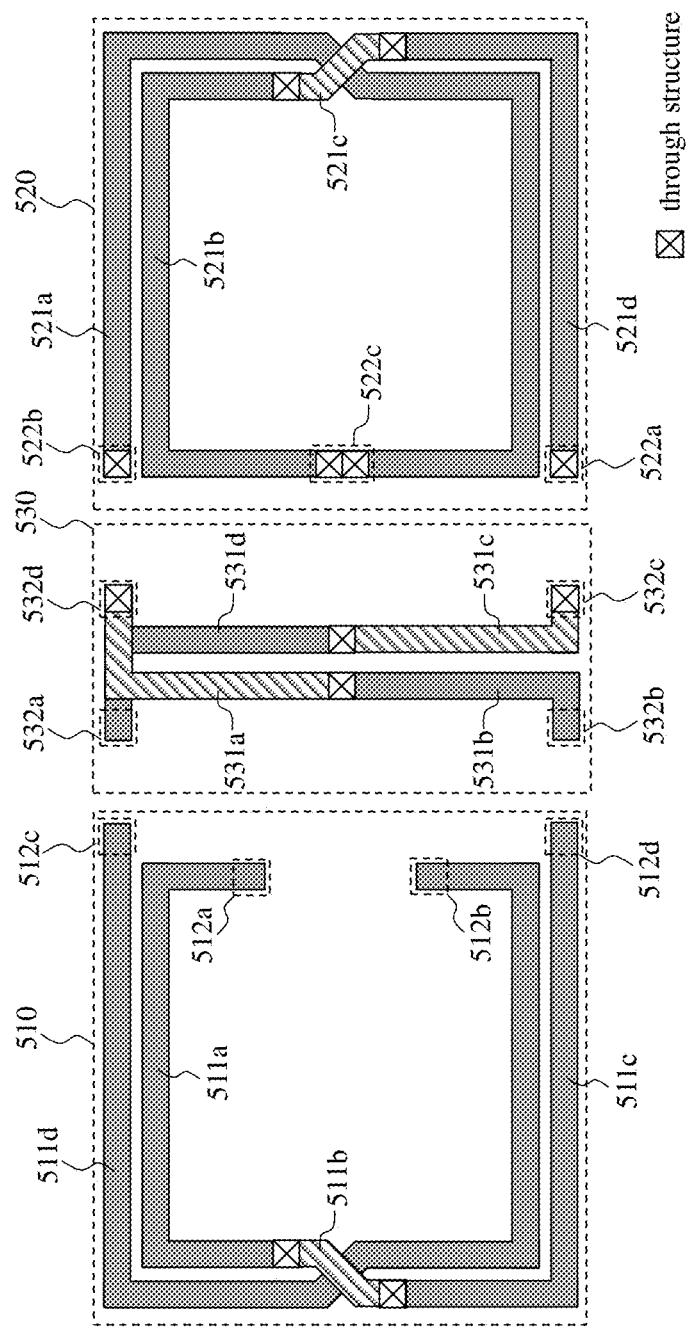
FIG. 5B illustrates the spiral coil 510, the spiral coil 510 and the connection section 530 individually.

FIG. 5B shows the spiral coil 510, the spiral coil 510 and the connection section 530 individually to illustrate the connections among these three components in a detailed manner. The spiral coils 510 and 520 are connected by the connection section 530. The spiral coil 510 includes metal segment 511a-511d. The metal segment 511b is fabricated in the upper metal layer, and the remaining metal segments are fabricated in the lower metal layer. The spiral coil 510 is a two-turn spiral structure, of which the inner turn is located in a range surrounded by the outer turn. The inner turn of the spiral coil 510 includes the metal segment 511a and a lower part of the metal segment 511d. The outer turn of the spiral coil 510 includes an upper part of the metal segment 511d and the metal segment 511c. Because the metal segment 511b takes up only a small part of the spiral coil 510, the spiral coil 510 is located at substantially the same metal layer, i.e., at substantially the same plane. Similarly, the spiral coil 520 includes metal segment 521a~521d. The metal segment 521c is fabricated in the upper metal layer, and the remaining metal segments are fabricated in the lower metal layer. The spiral coil 520 is a two-turn spiral structure, of which the inner turn is located in a range surrounded by the outer turn. The inner turn of the spiral coil 520 includes the metal segment 521b and a lower part of the metal segment 521a. The outer turn of the spiral coil 520 includes an upper part of the metal segment 521a and the metal segment 521d. Likewise, the spiral coil 520 is located at substantially the same metal layer, i.e., at substantially the same plane.

Figure 5C:
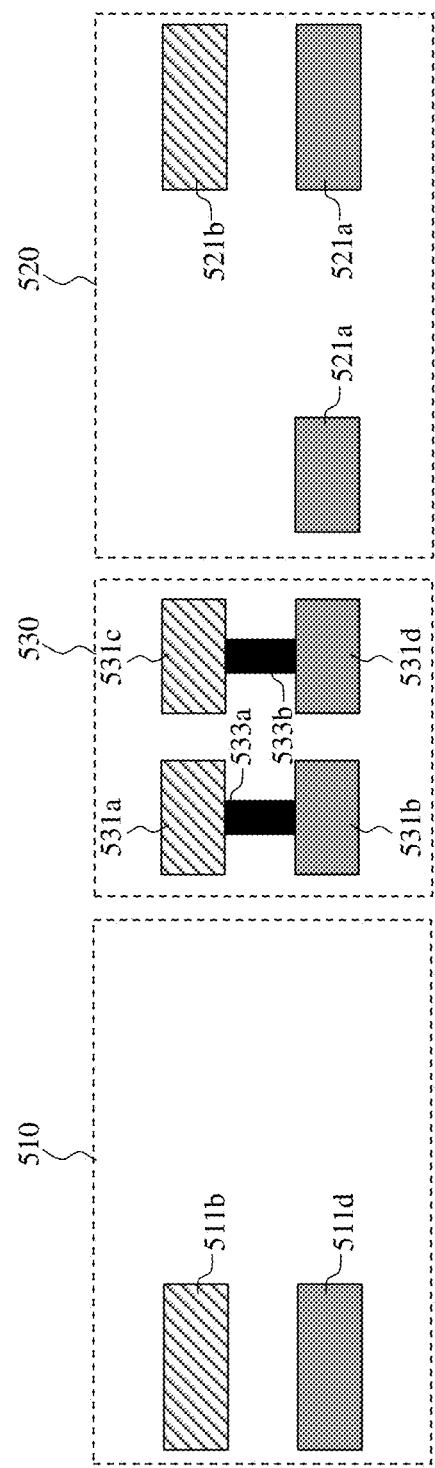
FIG. 5C illustrates a cross section of the semiconductor element 500 along a dotted line A-A in FIG. 5A.

The connection section 530 includes two connecting segments. One of the two connecting segments is formed by connecting the metal segment 531a and the metal segment 531b, with the metal segment 531a and the metal segment 531b located at different metal layers. The other of the two connecting segments is formed by connecting the metal segment 531c and the metal segment 531d, with the metal segment 531c and the metal segment 531d located at different metal layers. The connecting segment on the right-hand side of the figure (i.e., a connecting segment formed by connecting the metal segment 531c and the metal segment 531d) have two ends 532a and 532c that are respectively connected to the end 512c of the spiral coil 510 and the end 522a of the spiral coil 520. The connecting segment on the left-hand side of the figure (i.e., a connecting segment formed by connecting the metal segment 531a and the metal segment 531b) have two ends 532b and 532d that are respectively connected to the end 512d of the spiral coil 510 and the end 522*b* of the spiral coil 520. In this embodiment, the two connecting segments are substantially parallel to each other. The connection section 530 and the spiral coil 510 are directly connected, and the connection section 530 is connected to the spiral coil 520 by a through structure. FIG. 5C shows a cross section of the semiconductor element 500 along a dotted line A-A' in FIG. 5A. As shown in the figure, the metal segment 531*a* and the metal segment 531*b* are connected by the through structure 533*a*, and the metal segment 531*c* and the metal segment 531*d* are connected by the through structure 533*b*.

In a different embodiment, the spiral coil 510 may have an odd number of turns (similar to the spiral coils 210 and 310); in this case, the metal segments 550*a* and 550*b* do not overlap a range surrounded by the inner turn of the spiral coil 510, and do not overlap a range surrounded by the spiral coil 520, either.

Each of the aforementioned semiconductor elements 200, 300, 400 and 500 can be used as an integrated inductor, more specifically, an 8-shaped integrated inductor. Taking the semiconductor element 200 for example, the semiconductor element 200 includes two sensing units, one of which uses the metal segment 250*a* (equivalent to the end 212*a*) and the center tap 240 (equivalent to the connecting area 222*c*) as two ends thereof, while the other uses the metal segment 250*b* (equivalent to the end 212*b*) and the center tap 240 (equivalent to the connecting area 222*c*) as two ends thereof. For the sensing unit that includes the metal segment 250*a*, the electric current flows into the semiconductor element 200 through the metal segment 250*a*, and passes one half of the spiral coil 210 before entering the spiral coil 220 through the connection section 230. The electric current continues flowing through one half of the spiral coil 220 before exiting the semiconductor element 200 via the center tap 240. For the sensing unit that includes the metal segment 250*b*, the electric current flows into the semiconductor element 200 through the metal segment 250*b*, and passes the other half of the spiral coil 210 before entering the spiral coil 220 through the connection section 230. The electric current continues flowing through the other half of the spiral coil 220 before exiting the semiconductor element 200 via the center tap 240. Since the two sensing units have metal segments with substantially the same length, and have the same distribution of metal segments in each metal layer, the semiconductor element 200 is of excellent symmetry. In comparison with the prior art, the 8-shaped integrated inductor of the present invention is more symmetric. In fact, the end 212*a* and the end 212*b* can be regarded as one of the input port and the output port of the integrated inductor, whereas the connecting area 222*c* can be regarded as the other. The connecting areas 222*c*, 322*c*, 422*c*, and 522*c* are connecting points of the center tap of the integrated inductor. In fact, metal segments in those regions are continuous without breaking.

Each of the aforementioned semiconductor elements 200, 300, 400 and 500 can also be used as an integrated transformer. When used as an integrated transformer, taking semiconductor element 200 as an example, the spiral coil 220 of the semiconductor element 200 can be broken into two ends at the connecting area 222*c*. The integrated transformer uses the end 212*a* and the end 212*b* as one of the input port and the output port, and uses the two ends derived from the connecting area 222*c* as the other. The impedance matching effect or voltage magnification of the integrated transformer can be adjusted by altering the turns ratio of the spiral coil 210 and the spiral coil 220.

Most metal segments of the semiconductor element of the present invention can be fabricated in an ultra-thick metal (UTM) layer and a re-distribution layer (RDL) of a semiconductor structure. Taking the semiconductor element 200 in FIG. 2B as an example, most metal segments of the spiral coils 210 and 220 can be fabricated in the UTM layer (shaded in gray), and a small portion of the metal segments is fabricated in the RDL (shaded by slanted lines). In a different embodiment, most metal segments of the spiral coils 210 and 220 can be fabricated in the RDL, while a small portion of the metal segments is fabricated in the UTM layer. The center tap of a semiconductor element (e.g., the center tap 240 of FIG. 2A) is fabricated in another metal layer between a substrate and the UTM layer of a semiconductor structure. In a semiconductor structure, there may be a dielectric layer, such as silicon dioxide, between two metal layers. For the purpose of conciseness, the dielectric layers in cross sections of FIGS. 4C and 5C are omitted.

Please note that the shape, turns ratio, size, and ratio of any element in the disclosed figures are exemplary for understanding, not for limiting the scope of this invention. In addition, although the disclosed embodiments exemplarily demonstrate the applications of the semiconductor elements by applying them to an integrated inductor or an integrated transformer, people having ordinary skill in the art can apply the semiconductor elements to other electronic components.

The aforementioned descriptions represent merely the preferred embodiments of the present invention, without any intention to limit the scope of the present invention thereto. Various equivalent changes, alterations, or modifications based on the claims of the present invention are all consequently viewed as being embraced by the scope of the present invention.

What is claimed is:

1. A semiconductor element, comprising:
   a first spiral coil, formed with a first end and a second end and comprising a first inner turn and a first outer turn, wherein said first inner turn is surrounded by said first outer turn, and said first end and said second end are located at said first inner turn;
   a second spiral coil, wherein said second spiral coil and said first spiral coil are located at substantially a same metal layer;
   a connecting section, connecting said first spiral coil and said second spiral coil, and comprising a first connecting segment located in a first metal layer and a second connecting segment located in a second metal layer, wherein said first connecting segment and said second connecting segment are substantially parallel to each other and substantially overlap;
   a first guide segment, connected to said first end; and
   a second guide segment, connected to said second end;
   wherein, said first guide segment and said second guide segment are fabricated in a metal layer different from a metal layer of said first spiral coil.

2. The semiconductor element of claim 1, wherein a range surrounded by said first inner turn does not overlap with said first guide segment and said second guide segment, and a range surrounded by said second spiral coil does not overlap with said first guide segment and said second guide segment.

3. The semiconductor element of claim 1, wherein said second spiral coil comprises a second inner turn and a second outer turn, said second inner turn is located in a range surrounded by said second outer turn, and said connecting section connects said first outer turn and said second outer turn.

4. The semiconductor element of claim 1, wherein said semiconductor element is an integrated transformer, said second spiral coil comprises a third end and a fourth end, said first end and said second end form one of an input port and an output port of said integrated transformer, and said third end and said fourth end form the other of said input port and said output port.

5. A semiconductor element, comprising:
   a first spiral coil, formed with a first end and a second end and comprising a first inner turn and a first outer turn, wherein said first inner turn is surrounded by said first outer turn, and said first end and said second end are located at said first inner turn;
   a second spiral coil, wherein said second spiral coil and said first spiral coil are located at substantially a same metal layer;
   a connecting section, connecting said first spiral coil and said second spiral coil, and comprising a first connecting segment located in a first metal layer and a second connecting segment located in a second metal layer, wherein said first connecting segment and said second connecting segment are substantially parallel to each other and substantially overlap;
   a first guide segment, connected to said first end; and
   a second guide segment, connected to said second end;
   wherein, said first guide segment and said second guide segment are fabricated in a metal layer different from a metal layer of said first spiral coil;
   wherein, said first guide segment and said second guide segment partially overlap a range surrounded by said first inner turn, and do not partially overlap a range surrounded by said second spiral coil.

* * * * *